United States Patent [19]
Murphy et al.

[11] 4,240,026
[45] Dec. 16, 1980

[54] DETECTION OF FAULTS IN THE INSULATION OF AN ELECTRICAL CONDUCTOR USING A LIQUID ELECTROLYTE

[75] Inventors: Peter Murphy, Longueuil; Yvon O. Dionne, Chateauguay; Jerry J. Kral, Montreal; John Stefaniszyn, Beaconsfield, all of Canada

[73] Assignee: Northern Telecom Limited, Montreal, Canada

[21] Appl. No.: 50,770

[22] Filed: Jun. 21, 1979

[51] Int. Cl.³ .............................................. G01R 31/2
[52] U.S. Cl. ...................... 324/54; 324/52; 324/425
[58] Field of Search ............... 324/54, 52, 443, 425; 204/195 R

[56] References Cited

U.S. PATENT DOCUMENTS

| | | | |
|---|---|---|---|
| 3,349,324 | 10/1967 | Wakefield | 324/54 |
| 3,820,011 | 6/1974 | Hoveman | 324/54 |
| 3,970,924 | 7/1976 | Pendleton et al. | 324/54 |

*Primary Examiner*—David K. Moore
*Attorney, Agent, or Firm*—Sidney T. Jelly

[57] ABSTRACT

Faults, such as pinholes, in the insulation of an electrical conductor are detected by passing the conductor through a liquid electrolyte which acts as a liquid electrode. A regulated DC supply is connected to the electrolyte, the conductor core grounded, and the DC bias to the electrolyte monitored. Any variation in the DC bias, is detected and for any change over a predetermined minimum value a signal is produced, which can be used to actuate a marker or stop the line. More than one conductor can pass together, for example twisted pairs or quads as used for telecommunications.

16 Claims, 6 Drawing Figures

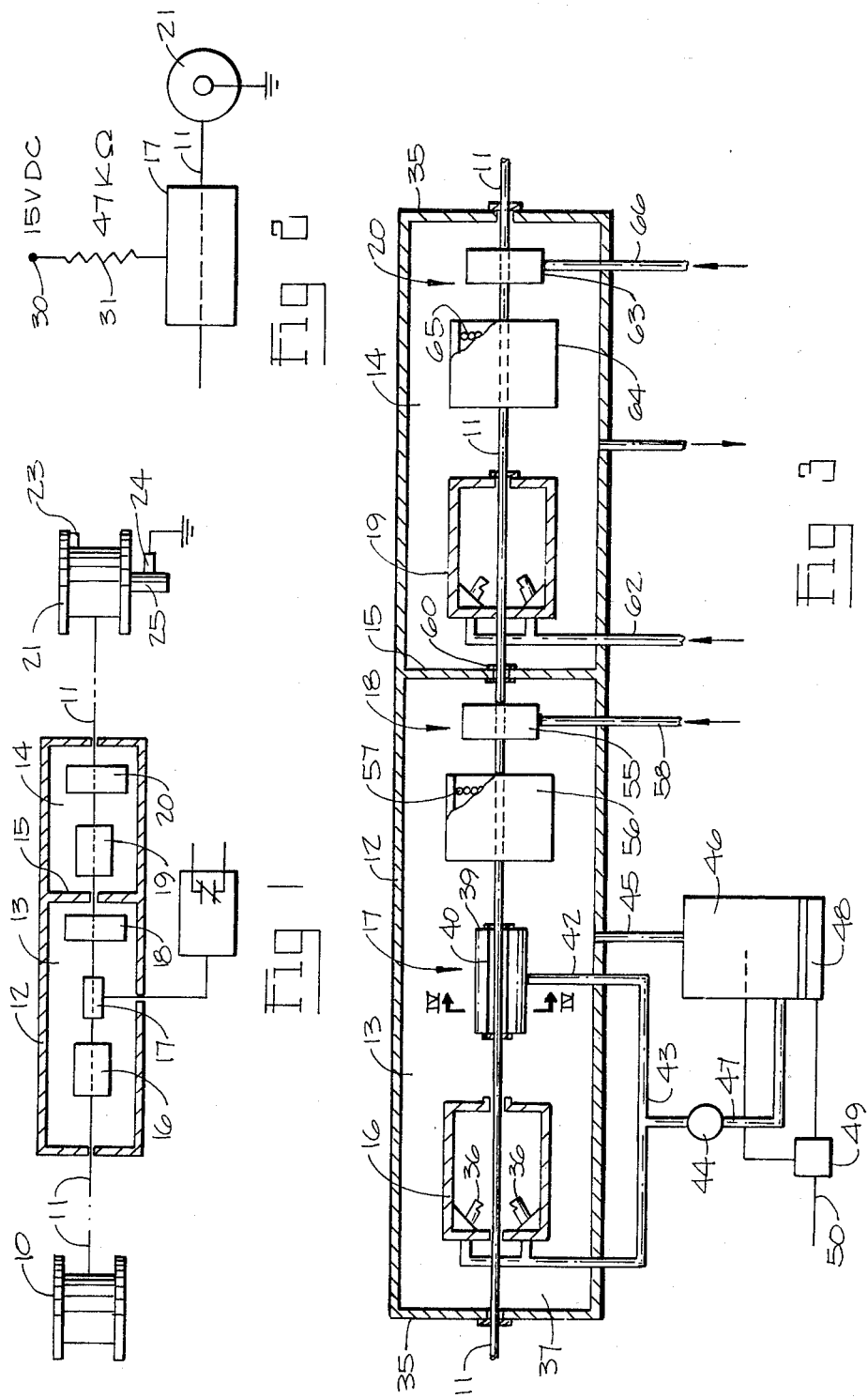

DETECTION OF FAULTS IN THE INSULATION OF AN ELECTRICAL CONDUCTOR USING A LIQUID ELECTROLYTE

This invention relates to the detection of faults in the insulation of an electrical conductor and is particularly applicable to the detection of pinholes in such insulation.

In many existing fault detectors, an electrical potential difference is maintained between the conductor and an electrode positioned adjacent to the path of the conductor. When a fault, such as a pinhole, in the insulation passes the electrode an arc discharge occurs between the conductor and electrode and can be detected.

Such spark, or arc, testing devices are difficult to adjust and set in order to discriminate between defects of a size which are important and should be detected, and smaller defects such as small pinholes which can be ignored. These forms of testing also suffer from long term unreliability because the characteristics of the detecting electrodes change randomly, due to dirt accumulation, wear and changes in ambient humidity. Further, the insulation in many cases, such as in conductors for telecommunications cables, has a low dielectric strength and it is possible to blow holes through the insulation if too high a voltage, or potential difference, is applied.

The invention is applicable to fault detection on a single conductor, or a plurality of conductors, advancing along a predetermined path, and in a particular application is suitable for testing twisted conductors for telecommunication cables. Broadly, the invention comprises the use of a liquid electrode in contact with the conductor or conductors with an electrical potential being maintained between conductor or conductors and the liquid electrode. An electrical circuit monitors the potential at the electrode and produces an output when a fault of, or over, a predetermined magnitude passes the electrode. The sensitivity of the detector can be variably controlled and is unaffected by line voltage fluctuations—a problem with regular spark testers.

The invention will be readily understood by the following description in conjunction with the accompanying drawings, in which:

FIG. 1 is a diagrammatic line drawing of a typical complete set-up;

FIG. 2 is a diagrammatic illustration of the liquid electrode detector;

FIG. 3 is a diagrammatic top view, to a larger scale, at the liquid electrode section of the arrangement illustrated in FIG. 1;

Figure 4:
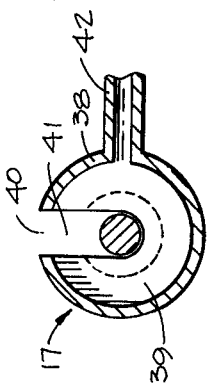
FIG. 4 is a cross-section, on the line IV—IV of FIG. 3, through the detector electrode.

The broad concept of the invention is illustrated in FIG. 1. From a give-up roll 10, a conductor 11 is fed through a housing 12 divided into two chambers 13 and 14 by a central wall 15. The conductor first passes through a pre-wetting station 16 then through the liquid electrode 17 and then through a drier 18.

After passing through the wall 15, the conductor passes through a washing station 19 and then through drier 20. Finally the conductor is wound onto take-up roll 21. A detector 22 is connected to the electrode 17 and the conductive core of the conductor 11 is connected to the take-up roll for example at 23, and the roll is in turn grounded via brushes 24 running on the spindle 25.

The electrode potential arrangement is illustrated in FIG. 2. The electrode 17 is, in the example, a tubular member into which a liquid electrolyte is pumped. A low Direct Current Regulated supply, e.g. 15 VDC is applied, at 30, via a resistor 31, to the tubular member, which is metallic, for example copper. The core of the conductor 11 is grounded as described above. If any fault occurs in the conductor insulation, the liquid electrolyte contacts the conductor core and a change in bias voltage occurs.

The housing 12 and the various sections therein are illustrated in more detail in FIG. 3. The conductor 11 enters the housing 12 through an aperture in the end wall 35 and passes through the prewetting station 16 and then the electrode 17. The prewetting station 16 is an enclosure having two spray-heads 36. Liquid electrolyte is pumped to the spray heads via pipe 37. The sprayed electrolyte ensures that the insulation is thoroughly wetted. The liquid electrode 17 is in the form of a copper tube 38 having end plates 39 as seen in FIG. 4, a slot 40 being cut in the top of the tube 38, and a radial slot 41 extending down each end plate 39 to the axis of the tube. Liquid electrolyte is fed into the tube via a pipe 42, liquid escaping through the radial slots 41. The pipe 42, as will be seen in FIG. 3, as well as pipe 37, are joined by a pipe 43 to which the output from pump 44 is connected. Liquid electrolyte drains from the chamber 13 of the housing 12 via pipe 45 into a reservoir 46. Pipe 47 leads from the reservoir 46 to the intake of the pump 44. The electrolyte is maintained at a predetermined temperature in the reservoir by an electric heater 48, controlled by a temperature controller 49, from electric supply 50.

As explained with respect to FIG. 2, as the conductor 11 passes through the liquid electrode 17, the electrolyte penetrates the insulation at any fault, pinhole or the like and change in the voltage bias between the DC supply and the conductor core occurs. This change can be used variously, as will be described.

After passing through the liquid electrode 17 the conductor is dried. This is carried out at the drier 18, which in the example illustrated in FIG. 3 comprises an air blower 55 which blows air upstream, that is in the opposite direction to the movement of the conductor through the apparatus. The air is ejected around the conductor and blows the electrolyte off in the form of a mist. Immediately upstream of the blower 55 is a screen 56, for example a chain screen. This comprises a curtain of bead chains hanging down, the mist impinging on the chains and forming into droplets which run down the chains and drip off into the base of the chamber 13. Some of the chains are indicated at 57. Air is supplied to the blower 55 via pipe 58. The electrolyte solution is such as will provide conductivity between conductor core and the copper tube of the electrode and preferably should have a conductivity approximately equivalent to that of 200 PPM of sodium chloride in distilled water at 37° C.

The conductor 11 leaves chamber 13 and enters chamber 14 through the wall 15, a bush 60 in an aperture in the wall 15 being a reasonably close fit around the conductor. In chamber 14 the conductors pass through washing station 19 which, in the example illustrated, is of the same form as the prewetting station 16, and comprises an enclosure with two spray heads 61 fed with water via pipe 62. From the washing station the conductor passes through another drier 20, again, in the example illustrated of the same form as the drier 18, and comprises blower 63 and screen 64 having a curtain of bead chains 65. Air is supplied to the blower 63 via pipe 66. The conductor then exits from the housing 12 through another end wall 35. The housing 12 and the associated piping and electrolyte pump must be isolated from ground. Conveniently the housing 12 and pump 40 are of electrically insulating material as is also the reservoir 46 and the piping 37, 42, 43, 45 and 47. This ensures that the bias voltage on the liquid electrode is maintained. Bushes may also be provided in the end walls 35.

Figure 5:
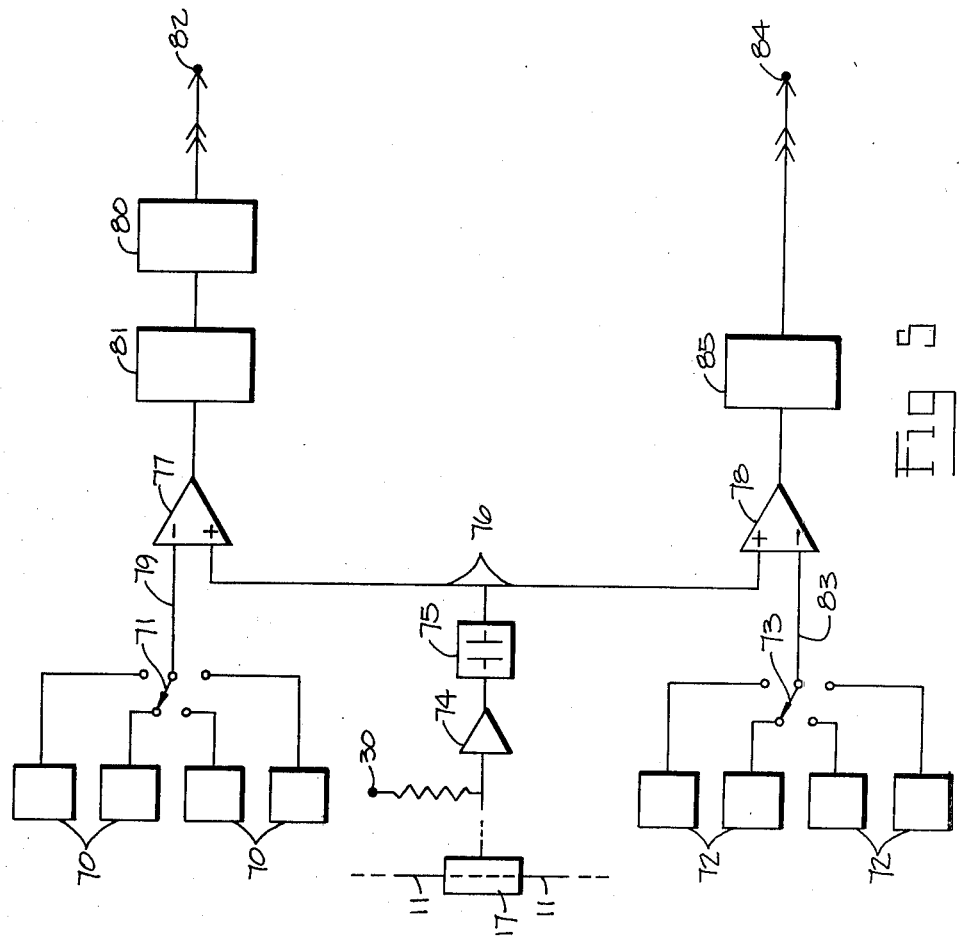
FIG. 5 is a diagrammatic circuit for the tester, providing two outputs for different uses.

FIG. 5 illustrates diagrammatically an electrical circuit for use in conjunction with the liquid electrode for providing two outputs, one for operating a relay which can be used either to actuate a marker for marking the conductor at the position where a fault occurs or to stop the line, the other actuating a counter. The particular circuit illustrated has a first plurality of adjustable voltage references 70 with a selector switch 71, associated with the relay actuation output and a second plurality of adjustable voltage references 72 with a selector switch 73, associated with the counter output. The liquid electrode is indicated at 17, with the DC voltage supply at 30. A connection from the electrode 17 is made via a buffer 74 to an AC coupling 75. A connection 76 extends from the coupling 75 to the positive terminal of each of two voltage comparators 77 and 78.

A connection 79 from the selector switch 71 extends to the negative terminal of voltage comparator 77. The comparator 77 thus compares the bias-voltage on the electrode against a preselected reference from one of the references 70. This reference can be set such that minor faults, such as small pinholes, will not cause a sufficient change in the electrode bias to produce an output from the comparator 77. On the occurrence of a larger fault with an associated larger change in electrode bias, an output will occur from the comparator, and is fed to a relay driver 80. To ensure actuation of the relay, the output pulse from the comparator 77 is stretched by a pulse stretcher 81. The connection to a relay, not shown, is indicated at 82. As stated, on actuation of the relay by the driver 80, either a mark can be made on the conductor, as by a spray of ink, or the line can be stopped.

A connection 83 extends from selector switch 73 to the negative terminal of comparator 78. Comparator 78 thus comprises the bias voltage on the electrode against a preselected reference from one of the references 72. This reference can be set at a lower value than that for comparator 77, and thus smaller faults can be detected as smaller changes in the voltage bias will result in an output from comparator 78 to a counter, not shown, but connection to which is indicated at 84. A pulse stretcher 85 is provided between the comparator 78 and the counter.

With the arrangement illustrated in FIG. 5, all faults above a predetermined minimum size can be counted, while only those faults larger than a predetermined size will cause either marking or shut down of the line. In actual production it is likely that only one reference 70 and one reference 72 will be provided, with means for presetting the reference value prior to starting the line. In some cases it may not be required that two outputs are required, only one output which marks or stops the line being provided.

Figure 6:
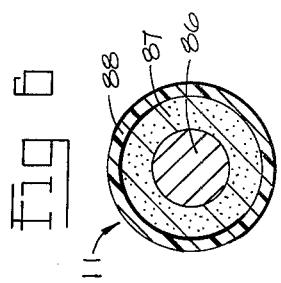
FIG. 6 is a cross-section through one form of conductor.

FIG. 6 illustrates one form of conductor 11 as could be processed through the system. The conductor has a metallic core 86, which can be of any conventional material, for example copper or aluminum, surrounded by a layer of pulp insulation 87. An outer plastic or nylon layer 88 is applied over the pulp. Twisted conductors can be tested, for example twisted pairs and quads as used for telecommunications cables.

What is claimed is:

1. Apparatus for the detection of faults in the insulation of a conductor having at least one electrically conductive core and an insulating layer on the core, comprising;
   a housing;
   means in said housing for holding a liquid electrolyte;
   means for passing an insulated conductor through said electrolyte;
   means for applying a regulated DC supply to said electrolyte; means for grounding the electrically conductive core of a conductor;
   means connected to the electrolyte to detect any change in electrical bias between said electrolyte and said core;
   means for producing a signal indicative of a change in said bias when said change is above a predetermined value.

2. Apparatus as claimed in claim 1 said housing including a wetting station, said means for holding a liquid electrolyte positioned after and in series with said wetting station, and a drier positioned after said means for holding the liquid electrolyte and in series therewith.

3. Apparatus as claimed in claim 2, including a washing station after said drier and a further drier after said washing station.

4. Apparatus as claimed in claim 3, said housing having a first chamber and a second chamber, said wetting station, said means for holding a liquid electrolyte and a first drier positioned in said first chamber, and said washing station and said further drier positioned in said second chamber.

5. Apparatus as claimed in claim 1 comprising, a tubular member having opposed end members, the axis of the tubular member parallel to the path of the conductor; a radial slot in each end member and a slot extending along the tubular member at a top position and connecting with said radial slots and means for continuously feeding liquid electrolyte to the interior of the tubular member.

6. Apparatus as claimed in claim 2, including means for feeding liquid electrolyte to the wetting station for prewetting said insulating layer prior to passage through the liquid electrolyte.

7. Apparatus as claimed in claim 6, said wetting station including spray heads for spraying the liquid electrolyte onto said conductor.

8. Apparatus as claimed in claim 6, said drier comprising a blower for blowing air along the conductor in a direction opposite to the direction of movement of the conductor, and a screen upstream of said blower for interception of electrolyte blown off of the conductor.

9. Apparatus as claimed in claim 3, including means for feeding water to said washing station for washing said conductor.

10. Apparatus as claimed in claim 9, said washing station including spray heads for spraying water onto said conductor.

11. Apparatus as claimed in claim 9, said further drier comprising a further blower for blowing air along the conductor in a direction opposite to the direction of movement of the conductor, and a screen upstream of said further blower for interception of water blown off of the conductor.

12. Apparatus as claimed in claim 4, said housing including a central wall dividing said housing into said two chambers.

13. Apparatus as claimed in claim 5 including means for recirculating the liquid electrolyte.

14. Apparatus as claimed in claim 13 including means for maintaining the electrolyte at a predetermined temperature.

15. Apparatus as claimed in claim 1, including means for actuation by said signal to impose a mark on the conductor.

16. Apparatus as claimed in claim 1, including means for actuation by said signal to stop the passage of the conductor through the housing.

* * * * *